United States Patent
Kim et al.

(10) Patent No.: US 11,342,387 B2
(45) Date of Patent: *May 24, 2022

(54) ORGANIC LIGHT-EMITTING DISPLAY APPARATUS

(71) Applicant: SAMSUNG DISPLAY CO., LTD., Yongin-si (KR)

(72) Inventors: Dongchan Kim, Yongin-si (KR); Byoungduk Lee, Yongin-si (KR); Yoonhyeung Cho, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 719 days.

This patent is subject to a terminal disclaimer.

(21) Appl. No.: 15/464,926

(22) Filed: Mar. 21, 2017

(65) Prior Publication Data

US 2017/0365645 A1     Dec. 21, 2017

(30) Foreign Application Priority Data

Jun. 15, 2016 (KR) .................. 10-2016-0074725

(51) Int. Cl.
  *H01L 51/54* (2006.01)
  *H01L 27/32* (2006.01)
  *H01L 51/50* (2006.01)

(52) U.S. Cl.
  CPC ........ *H01L 27/322* (2013.01); *H01L 51/5036* (2013.01)

(58) Field of Classification Search
  CPC ........... C07C 211/63; H01L 2251/5369; H01L 27/322
  USPC ....... 428/690, 691, 917, 411.4, 336; 427/58, 427/66; 313/500–512; 257/40, 88–104, 257/E51.001, E51.052; 252/301.16–301.35
  See application file for complete search history.

(56) References Cited

U.S. PATENT DOCUMENTS

| | | | |
|---|---|---|---|
| 5,882,548 A | 3/1999 | Liang et al. | |
| 8,013,519 B2 | 9/2011 | Boerner | |
| 9,035,286 B2 | 5/2015 | Chen et al. | |
| 10,538,699 B2 * | 1/2020 | Kim et al. | |
| 2014/0231753 A1 | 8/2014 | Chen et al. | |

FOREIGN PATENT DOCUMENTS

| | | |
|---|---|---|
| CN | 101073165 | 11/2007 |
| CN | 103682115 | 3/2014 |
| CN | 103682153 | 3/2014 |
| CN | 104979494 | 10/2015 |
| EP | 3255120 | 12/2017 |
| JP | 2016-021488 | 2/2016 |
| KR | 1020140042274 | 4/2014 |
| KR | 1020150089961 | 8/2015 |
| WO | 2016124324 | 8/2016 |
| WO | 2017/108962 | 6/2017 |

OTHER PUBLICATIONS

European Search Report dated Nov. 10, 2017 in corresponding European Application No. 17176178.6. (12 Pages).
Song, Jizhong, et al. "Quantum Dot Light-Emitting Diodes Based on Inorganic Perovskite Cesium Lead Halides (CsPbX3)." Advanced materials 27.44 (2015): 7162-7167.
Zhang, et al., Brightly Luminescent and color—Tunable Colloidal CH3NH3PbX3 (X=Br, I, Cl) Quantum Dots Potential Alternatives for Display Technology; ACS NANO, 2015, vol. 9, No. 4, pp. 4533-4542.
Protesescu, et al., Nanocrystals of Cesium Lead Halide Perovskites (CsPbX3, X=Cl, Br, and I): Novel Optoelectronic Materials showing Bright Emission with Wide Color Gamut, NANO Letters, 2015, 15, pp. 3962-3695.
Cho, et al., "Overcoming the electroluminescence efficiency limitations of perovskite light-emitting diodes", Science, Dec. 4, 2015, vol. 350, Issue 6265, pp. 1222-1225.
Mitzi, et al., "Preparation and Properties of (C4H9NH3)2EuI4: A Luminescent Organic—Inorganic Perovskite with a Divalent Rare-Earth Metal Halide Framework", Chem. Mater. 1997, 9, pp. 2990-2995.
Chinese Office Action dated Jun. 29, 2020 issued in corresponding Chinese Patent Application No. 201710451307.7.

* cited by examiner

*Primary Examiner* — Andrew K Bohaty
(74) *Attorney, Agent, or Firm* — F. Chau & Associates, LLC (57) ABSTRACT

Provided is an organic light-emitting display apparatus. The organic light-emitting display apparatus includes a first substrate; an organic light-emitting device disposed on the first substrate; and a thin film comprising at least one perovskite compound represented by Formula 1 disposed on the organic light-emitting device. T the thin film is positioned in a traveling direction of light emitted from the organic light-emitting device:

$$[A][B^1{}_n B^2{}_{(1-n)}][X]_3 \quad \text{<Formula 1>}$$

A is at least one monovalent organic-cation, at least one monovalent inorganic-cation, or a combination thereof. $B^1$ and $B^2$ are each independently at least one divalent inorganic-cation. n is a real number satisfying $0<n\leq 1$. X is at least one monovalent anion.

19 Claims, 6 Drawing Sheets

ORGANIC LIGHT-EMITTING DISPLAY APPARATUS

CROSS-REFERENCE TO RELATED APPLICATION

This application claims priority under 35 U.S.C. § 119 to Korean Patent Application No. 10-2016-0074725, filed on Jun. 15, 2016, in the Korean Intellectual Property Office, the disclosure of which is incorporated by reference herein in its entirety.

1. TECHNICAL FIELD

Exemplary embodiments of the present invention relate to a display apparatus, and more particularly to an organic light-emitting display apparatus.

2. DISCUSSION OF RELATED ART

An organic light-emitting display apparatus may include an organic light-emitting device that includes an anode, a cathode, and an organic emission layer disposed the anode and the cathode. Excitons produced by recombining electrons with holes in the organic emission layer may transition from an excited state to a ground state, thus generating light.

The organic light-emitting display apparatus might not include a separate light source, and thus the organic light-emitting display apparatus can be driven with a low voltage and can be configured to have a reduced thickness and/or a relatively light weight. Organic light-emitting display apparatuses may have a relatively wide viewing angle, relatively high contrast, and a relatively short response time. Organic light-emitting display apparatuses may be used in personal portable electronic device, such as an MP3 player or a mobile phone, or in televisions (TV).

SUMMARY

One or more exemplary embodiments of the present invention include an organic light-emitting display apparatus having an increased color gamut.

According to one or more embodiments, an organic light-emitting display apparatus includes a first substrate; an organic light-emitting device disposed on the first substrate; and a thin film comprising at least one perovskite compound represented by Formula 1 disposed on the organic light-emitting device. T the thin film is positioned in a traveling direction of light emitted from the organic light-emitting device:

$[A][B^1_n B^2_{(1-n)}][X]_3$  <Formula 1>

A is at least one monovalent organic-cation, at least one monovalent inorganic-cation, or a combination thereof. $B^1$ and $B^2$ are each independently at least one divalent inorganic-cation. n is a real number satisfying $0 < n \leq 1$. X is at least one monovalent anion.

BRIEF DESCRIPTION OF THE DRAWINGS

The above and other features of the present invention will become more apparent by describing in detail exemplary embodiments thereof, with reference to the accompanying drawings, in which.

DETAILED DESCRIPTION

Exemplary embodiments of the present invention will be described below in more detail with reference to the accompanying drawings. In this regard, the exemplary embodiments may have different forms and should not be construed as being limited to the exemplary embodiments of the present invention described herein.

It will be understood that when a component, such as a layer, a film, a region, or a plate, is referred to as being "on" another component, the component can be directly on the other component or intervening components may be present. Sizes of components in the drawings may be exaggerated for clarify to description.

While such terms as "first," and "second" may be used to describe various components, such components are not limited to the above terms. The above terms may be used to distinguish one component from another.

In the present specification, an expression used in the singular may encompasses the expression of the plural.

A perovskite compound refers to a compound having a perovskite crystal structure, which is a 3-dimensional crystal structure related to a $CaTiO_3$ crystal structure.

Figure 1:
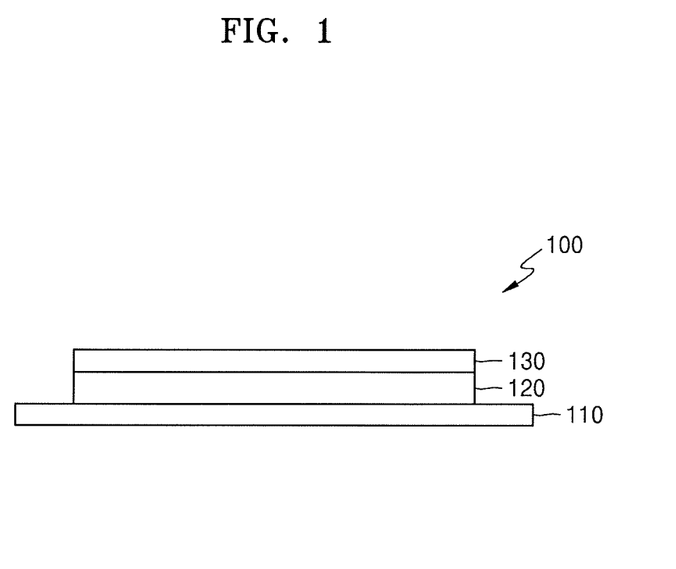
FIG. 1 is a schematic cross-sectional view of an organic light-emitting display apparatus according to an exemplary embodiment of the present invention.

FIG. 1 is a schematic cross-sectional view of an organic light-emitting display apparatus according to an exemplary embodiment of the present invention. FIGS. 2 to 5 are each an enlarged cross-sectional view of a part of an organic light-emitting display apparatus according to an exemplary embodiment of the present invention.

Referring to FIG. 1, an organic light-emitting display apparatus 100 includes a first substrate 110. The first substrate 110 may be a glass substrate or a transparent plastic substrate, each with relatively high mechanical strength, relatively high thermal stability, relatively high transparency, relatively high surface smoothness, relatively high ease of handling, and relatively high water resistance. In some exemplary embodiments of the present invention, the organic light-emitting display apparatus 100 may be a top-emission type organic light-emitting display apparatus, and the first substrate 110 may include materials selected from iron, chromium, manganese, nickel, titanium, molybdenum, stainless steel, an Invar alloy, an Inconel alloy, a Kovar alloy, or any combination thereof. However, exemplary embodiments of the present invention are not limited thereto.

An organic light-emitting device 120 may be disposed on the first substrate 110. The organic light-emitting device 120 may include a first electrode, a second electrode facing the first electrode, and an organic layer between the first electrode and the second electrode. The organic layer may include an emission layer.

The first electrode may be an anode. A material included in the first electrode may have a relatively high work function. Thus, hole injection may be facilitated in the first electrode. The first electrode may be a reflective electrode. A material for forming the first electrode may be selected from magnesium (Mg), silver (Ag), aluminum (Al), aluminum-lithium (Al—Li), calcium (Ca), magnesium-indium (Mg—In), magnesium-silver (Mg—Ag), or any combination thereof. However, exemplary embodiments of the present invention are not limited thereto.

The first electrode may include an inclined surface at a predetermined angle around the first electrode, and thus light emitted from the organic layer (e.g., light emitted along a horizontal direction of the organic light-emitting display apparatus 100) may travel toward a thin film 130. The inclined surface may be on a pixel-defining layer, and thus light emitted from the organic layer may be reflected by the inclined surface of the first electrode and travel toward the thin film 130, thus increasing luminous efficiency of the organic light-emitting display apparatus 100.

The organic layer may include a hole transport region between the first electrode and the emission layer and an electron transport region between the emission layer and the second electrode.

The second electrode may be a cathode, and a material for forming the second electrode may be selected from a metal, an alloy, an electrically conductive compound, or any combination thereof. A material included in the second electrode may have a relatively low work function. The second electrode may be a transmissive electrode or a semi-transmissive electrode, and the material for forming the second electrode may be selected from indium tin oxide (ITO), indium zinc oxide (IZO), tin oxide ($SnO_2$), zinc oxide (ZnO), Mg, Ag, Al, Al—Li, calcium (Ca), Mg—In, Mg—Ag, or any combination thereof.

In some exemplary embodiments of the present invention, the thin film 130 including at least one perovskite compound represented by Formula 1 may be disposed on the organic light-emitting device 120. The thin film 130 may be positioned in a traveling direction of light emitted from the organic light-emitting device 120:

$$[A][B^1_n B^2_{(1-n)}][X]_3 \qquad \text{<Formula 1>}$$

In Formula 1:

A may be at least one monovalent organic-cation, at least one monovalent inorganic-cation, or any combination thereof, $B^1$ and $B^2$ may each independently be at least divalent inorganic-cation. $B^1$ and $B^2$ may be the same as or different from each other, n may be a real number satisfying $0 < n \leq 1$, and X may be at least one monovalent anion.

As an example, in Formula 1, A may be one monovalent organic-cation, one monovalent inorganic-cation, a combination of two or more different monovalent organic-cations, a combination of two or more different monovalent inorganic-cations, or a combination of a monovalent organic-cation and a monovalent-inorganic-cation.

In some exemplary embodiments of the present invention, in Formula 1, A may be $(R_1R_2R_3C)^+$, $(R_1R_2R_3R_4N)^+$, $(R_1R_2R_3R_4P)^+$, $(R_1R_2R_3R_4As)^+$, $(R_1R_2R_3R_4Sb)^+$, $(R_1R_2N=C(R_3)-NR_4R_5)^+$, a substituted or unsubstituted 5-membered nitrogen-containing monovalent cation, a substituted or unsubstituted 6-membered nitrogen-containing monovalent cation, a substituted or unsubstituted 7-membered nitrogen-containing monovalent cation, $Li^+$, $Na^+$, $K^+$, $Rb^+$, $Cs^+$, $Fr^+$, or any combination thereof.

$R_1$ to $R_5$, at least one of substituents of the substituted 5-membered nitrogen-containing monovalent cation, at least one of substituents of the substituted 6-membered nitrogen-containing monovalent cation, and at least one of substituents of the substituted 7-membered nitrogen-containing monovalent cation may each independently be selected from hydrogen, deuterium, —F, —Cl, —Br, —I, a hydroxyl group, a substituted or unsubstituted $C_1$-$C_{10}$ alkyl group, a substituted or unsubstituted $C_2$-$C_{10}$ alkenyl group, a substituted or unsubstituted $C_2$-$C_{10}$ alkynyl group, a substituted or unsubstituted $C_1$-$C_{10}$ alkoxy group, a substituted or unsubstituted $C_6$-$C_{20}$ aryl group, or —N($Q_1$)($Q_2$).

$Q_1$ and $Q_2$ may each independently be selected from hydrogen, deuterium, a hydroxyl group, a $C_1$-$C_{20}$ alkyl group, a $C_2$-$C_{20}$ alkenyl group, a $C_2$-$C_{20}$ alkynyl group, a $C_1$-$C_{20}$ alkoxy group, or a $C_6$-$C_{20}$ aryl group.

The "5-membered nitrogen-containing ring" and the "6-membered nitrogen-containing ring" used herein may each refer to an organic cyclic group including at least one N and at least one C as ring-forming atoms.

The "7-membered ring" used herein may refer to an organic cyclic group including C as a ring-forming atom.

For example, the "5-membered nitrogen-containing ring" may be an imidazole, a pyrazole, a thiazole, an oxazole, a pyrrolidine, a pyrrolylene, a pyrrole, or a triazolyl. For example, the "6-membered nitrogen-containing ring" may be a pyridine, a pyridazine, a pyrimidine a pyrazine, or a piperidine. For example, the "7-membered nitrogen-containing ring" may be a cycloheptriene. However, exemplary embodiments of the present invention are not limited thereto.

In some exemplary embodiments of the present invention, in Formula 1, A may be $(R_1R_2R_3C)^+$, $(R_1R_2R_3R_4N)^+$, $(R_1R_2R_3R_4P)^+$, $(R_1R_2R_3R_4As)^+$, $(R_1R_2R_3R_4Sb)^+$, $(R_1R_2N=C(R_3)-NR_4R_5)^+$, a substituted or unsubstituted cycloheptatrienium, a substituted or unsubstituted imidazolium, a substituted or unsubstituted pyridinium, a substituted or unsubstituted pyridazium, a substituted or unsubstituted pyrimidinium, a substituted or unsubstituted pyrazinium, a substituted or unsubstituted pyrazolium, a substituted or unsubstituted thiazolium, a substituted or unsubstituted oxazolium, a substituted or unsubstituted piperidinium, a substituted or unsubstituted pyrrolidinium, a substituted or unsubstituted pyrrolinium, a substituted or unsubstituted pyrrolium, a substituted or unsubstituted triazolium, $Li^+$, $Na^+$, $K^+$, $Rb^+$, $Cs^+$, $Fr^+$, or any combination thereof.

$R_1$ to $R_5$, at least one of substituents of the substituted cycloheptatrienium, at least one of substituents of the substituted imidazolium, at least one of substituents of the substituted pyridinium, at least one of substituents of the substituted pyridazium, at least one of substituents of the substituted pyrimidinium, at least one of substituents of the substituted pyrazinium, at least one of substituents of the substituted pyrazolium, at least one of substituents of the substituted thiazolium, at least one of substituents of the substituted oxazolium, at least one of substituents of the substituted piperidinium, at least one of substituents of the substituted pyrrolidinium, at least one of substituents of the substituted pyrrolinium, at least one of substituents of the substituted pyrrolium, and at least one of substituents of the substituted triazolium may each independently be selected from:

hydrogen, deuterium, —F, —Cl, —Br, —I, a hydroxyl group, a $C_1$-$C_{20}$ alkyl group, a $C_2$-$C_{10}$ alkenyl group, a $C_2$-$C_{10}$ alkynyl group, or a $C_1$-$C_{20}$ alkoxy group;

a $C_1$-$C_{20}$ alkyl group, a $C_2$-$C_{10}$ alkenyl group, a $C_2$-$C_{10}$ alkynyl group, and a $C_1$-$C_{20}$ alkoxy group, each substituted with at least one selected from deuterium, —F, —Cl, —Br, —I, or a hydroxyl group;

a phenyl group, a naphthyl group, a biphenyl group, or a ter-phenyl group;

a phenyl group, a naphthyl group, a biphenyl group, and a ter-phenyl group, each substituted with at least one selected from deuterium, —F, —Cl, —Br, —I, a hydroxyl group, a $C_1$-$C_{20}$ alkyl group, a $C_2$-$C_{10}$ alkenyl group, a $C_2$-$C_{10}$ alkynyl group, or a $C_1$-$C_{20}$ alkoxy group; or

—N($Q_1$)($Q_2$).

$Q_1$ and $Q_2$ may each independently be selected from hydrogen, deuterium, a $C_1$-$C_{20}$ alkyl group, a $C_2$-$C_{10}$ alkenyl group, a $C_2$-$C_{10}$ alkynyl group, a $C_1$-$C_{20}$ alkoxyl group, a phenyl group, a naphthyl group, a biphenyl group, or a ter-phenyl group, however, exemplary embodiments of the present invention are not limited thereto.

In some exemplary embodiments of the present invention, in Formula 1, A may be $(R_1R_2R_3R_4N)^+$, $(R_1R_2R_3R_4P)^+$, $(R_1R_2R_3R_4As)^+$, $(R_1R_2R_3R_4Sb)^+$, a substituted or unsubstituted cycloheptatrienium, $Li^+$, $Na^+$, $K^+$, $Rb^+$, $Cs^+$, $Fr^+$, or any combination thereof.

$R_1$ to $R_4$ and at least one of substituents of the substituted cycloheptatrienium may each independently be selected from hydrogen, deuterium, —F, —Cl, —Br, —I, a hydroxyl group, a $C_1$-$C_{20}$ alkyl group, a $C_2$-$C_{10}$ alkenyl group, a $C_2$-$C_{10}$ alkynyl group, a $C_1$-$C_{20}$ alkoxy group, or —N($Q_1$)($Q_2$).

$Q_1$ and $Q_2$ may each independently be selected from hydrogen, deuterium, a $C_1$-$C_{20}$ alkyl group, a $C_2$-$C_{10}$ alkenyl group, a $C_2$-$C_{10}$ alkynyl group, or a $C_1$-$C_{20}$ alkoxy group, however, exemplary embodiments of the present invention are not limited thereto.

In some exemplary embodiments of the present invention, in Formula 1, A may be $(CH_3NH_3)^+$, $(C_2H_6PH_2)^+$, $(CH_3AsH_3)^+$, $(NH_4)^+$, $(CH_3SbH_3)^+$, $(C_2H_6NH_2)^+$, $(PH_4)^+$, $(CH_2N_2H_4)^+$, $(PF_4)^+$, $(CH_3PH_3)^+$, $(C_7H_7)^+$, $(SbH_4)^+$, $(AsH_4)^+$, $(NCl_4)^+$, $(NH_3OH)^+$, $(NH_3NH_2)^+$, $(CH(NH_2)_2)^+$, $(C_3N_2H_5)^+$, $((CH_3)_2NH_2)^+$, $(NC_4H_8)^+$, $((CH_3CH_2)NH_3)^+$, $((NH_2)_3C)^+$, $Li^+$, $Na^+$, $K^+$, $Rb^+$, $Cs^+$, $Fr^+$, or any combination thereof, however, exemplary embodiments of the present invention are not limited thereto.

In some exemplary embodiments of the present invention, in Formula 1, A may be $(CH_3NH_3)^+$, $K^+$, $Rb^+$, $Cs^+$, or any combination thereof, however, exemplary embodiments of the present invention are not limited thereto.

In some exemplary embodiments of the present invention, in Formula 1, $B^1$ and $B^2$ may each independently be one divalent inorganic-cation, or a combination of two or more different divalent inorganic-cations.

In some exemplary embodiments of the present invention, in Formula 1, $B^1$ and $B^2$ may each independently be a divalent cation of a rare earth metal, a divalent cation of an alkaline earth metal, a divalent cation of a post-transition metal, or any combination thereof, however, exemplary embodiments of the present invention are not limited thereto.

In some exemplary embodiments of the present invention, in Formula 1, $B^1$ and $B^2$ may each independently be $La^{2+}$, $Ce^{2+}$, $Pr^{2+}$, $Nd^{2+}$, $Pm^{2+}$, $Eu^{2+}$, $Gd^{2+}$, $Tb^{2+}$, $Ho^{2+}$, $Er^{2+}$, $Tm^{2+}$, $Yb^{2+}$, $Lu^{2+}$, $Be^{2+}$, $Mg^{2+}$, $Ca^{2+}$, $Sr^{2+}$, $Ba^{2+}$, $Ra^{2+}$, $Pb^{2+}$, $Sn^{2+}$, or any combination thereof, however, exemplary embodiments of the present invention are not limited thereto.

In some exemplary embodiments of the present invention, in Formula 1, $B^1$ and $B^2$ may each independently be $La^{2+}$, $Ce^{2+}$, $Pr^{2+}$, $Nd^{2+}$, $Pm^{2+}$, $Eu^{2+}$, $Gd^{2+}$, $Tb^{2+}$, $Ho^{2+}$, $Er^{2+}$, $Tm^{2+}$, $Yb^{2+}$, $Mg^{2+}$, $Ca^{2+}$, $Sr^{2+}$, $Ba^{2+}$, $Pb^{2+}$, $Sn^{2+}$, or any combination thereof, however, exemplary embodiments of the present invention are not limited thereto.

In some exemplary embodiments of the present invention, in Formula 1, $B^1$ may be $Pb^{2+}$, $Sn^{2+}$, or any combination thereof, and $B^2$ may be $La^{2+}$, $Ce^{2+}$, $Pr^{2+}$, $Nd^{2+}$, $Pm^{2+}$, $Eu^{2+}$, $Gd^{2+}$, $Tb^{2+}$, $Ho^{2+}$, $Er^{2+}$, $Tm^{2+}$, $Yb^{2+}$, $Mg^{2+}$, $Ca^{2+}$, $Sr^{2+}$, $Ba^{2+}$, or any combination thereof.

In some exemplary embodiments of the present invention, in Formula 1, $B^1$ may be $Tm^{2+}$, and $B^2$ may be $La^{2+}$, $Ce^{2+}$, $Pr^{2+}$, $Nd^{2+}$, $Pm^{2+}$, $Eu^{2+}$, $Gd^{2+}$, $Tb^{2+}$, $Ho^{2+}$, $Er^{2+}$, $Yb^{2+}$, $Mg^{2+}$, $Ca^{2+}$, $Sr^{2+}$, $Ba^{2+}$, $Pb^{2+}$, $Sn^{2+}$, or any combination thereof, however, exemplary embodiments of the present invention are not limited thereto.

As an example, in Formula 1, n may be a real number satisfying 0<n<1, however, exemplary embodiments of the present invention are not limited thereto.

In some exemplary embodiments of the present invention, in Formula 1, $B^1$ may be $Pb^{2+}$, $Sn^{2+}$, or any combination thereof, and $B^2$ may be $La^{2+}$, $Ce^{2+}$, $Pr^{2+}$, $Nd^{2+}$, $Pm^{2+}$, $Eu^{2+}$, $Gd^{2+}$, $Tb^{2+}$, $Ho^{2+}$, $Er^{2+}$, $Tm^{2+}$, $Yb^{2+}$, $Mg^{2+}$, $Ca^{2+}$, $Sr^{2+}$, $Ba^{2+}$, or any combination thereof.

In some exemplary embodiments of the present invention, in Formula 1, $B^1$ may be $Tm^{2+}$, and $B^2$ may be $La^{2+}$, $Ce^{2+}$, $Pr^{2+}$, $Nd^{2+}$, $Pm^{2+}$, $Eu^{2+}$, $Gd^{2+}$, $Tb^{2+}$, $Ho^{2+}$, $Er^{2+}$, $Yb^{2+}$, $Mg^{2+}$, $Ca^{2+}$, $Sr^{2+}$, $Ba^{2+}$, $Pb^{2+}$, $Sn^{2+}$, or any combination thereof.

As in example, in Formula 1, n may be a real number satisfying 0<n<1, however, exemplary embodiments of the present invention are not limited thereto.

In some exemplary embodiments of the present invention, in Formula 1, $B^2$ may be $Eu^{+2}$ and/or n may be a real number satisfying $0.05 \leq n \leq 0.4$, however, exemplary embodiments of the present invention are not limited thereto.

As an example, in Formula 1, X may be one monovalent anion, or a combination of two or more different monovalent anions, however, exemplary embodiments of the present invention are not limited thereto.

In some exemplary embodiments of the present invention, in Formula 1, X may be at least one halide anion (e.g., —F, —Cl, —Br, and —I).

In some exemplary embodiments of the present invention, in Formula 1, X may be $I^-$, however, exemplary embodiments of the present invention are not limited thereto.

In some exemplary embodiments of the present invention, the perovskite compound represented by Formula 1 may be selected from $[CH_3NH_3][Pb][I]_3$, $[CH_3NH_3][Pb_nSr_{(1-n)}][I]_3$, $[CH_3NH_3][Pb_nMg_{(1-n)}][I]_3$, $[CH_3NH_3][Pb_nCa_{(1-n)}][I]_3$, $[CH_3NH_3][Pb_nBa_{(1-n)}][I]_3$, $[CH_3NH_3][Pb_nEu_{1-n}][I]_3$, $[CH_3NH_3][Pb_nYb_{(1-n)}][I]_3$, $[CH_3NH_3][Pb_nTm_{(1-n)}][I]_3$, $[CH_3NH_3][Pb_nLa_{(1-n)}][I]_3$, $[CH_3NH_3][Pb_nCe_{(1-n)}][I]_3$, $[CH_3NH_3][Pb_nPr_{(1-n)}][I]_3$, $[CH_3NH_3][Pb_nNd_{(1-n)}][I]_3$, $[CH_3NH_3][Pb_nPm_{(1-n)}][I]_3$, $[CH_3NH_3][Pb_nGd_{(1-n)}][I]_3$, $[CH_3NH_3][Pb_nTb_{(1-n)}][I]_3$, $[CH_3NH_3][Pb_nHo_{(1-n)}][I]_3$, or $[CH_3NH_3][Pb_nEr_{(1-n)}][I]_3$;

$[Cs][Pb][I]_3$, $[Cs][Pb_nSr_{(1-n)}][I]_3$, $[Cs][Pb_nMg_{(1-n)}][I]_3$, $[Cs][Pb_nCa_{(1-n)}][I]_3$, $[Cs][Pb_nBa_{(1-n)}][I]_3$, $[Cs][Pb_nEu_{(1-n)}][I]_3$, $[Cs][Pb_nYb_{(1-n)}][I]_3$, $[Cs][Pb_nTm_{(1-n)}][I]_3$, $[Cs][Pb_nLa_{(1-n)}][I]_3$, $[Cs][Pb_nCe_{(1-n)}][I]_3$, $[Cs][Pb_nPr_{(1-n)}][I]_3$, $[Cs][Pb_nNd_{(1-n)}][I]_3$, $[Cs][Pb_nPm_{(1-n)}][I]_3$, $[Cs][Pb_nGd_{(1-n)}][I]_3$, $[Cs][Pb_nTb_{(1-n)}][I]_3$, $[Cs][Pb_nHo_{(1-n)}][I]_3$, or $[Cs][Pb_nEr_{(1-n)}][I]_3$;

$[CH_3NH_3][Sn][I]_3$, $[CH_3NH_3][Sn_nSr_{(1-n)}][I]_3$, $[CH_3NH_3][Sn_nMg_{(1-n)}][I]_3$, $[CH_3NH_3][Sn_nCa_{(1-n)}][I]_3$, $[CH_3NH_3][Sn_nBa_{(1-n)}][I]_3$, $[CH_3NH_3][Sn_nEu_{(1-n)}][I]_3$, $[CH_3NH_3][Sn_nYb_{(1-n)}][I]_3$, $[CH_3NH_3][Sn_nTm_{(1-n)}][I]_3$, $[CH_3NH_3][Sn_nLa_{(1-n)}][I]_3$, $[CH_3NH_3][Sn_nCe_{(1-n)}][I]_3$, $[CH_3NH_3][Sn_nPr_{(1-n)}][I]_3$, $[CH_3NH_3][Sn_nNd_{(1-n)}][I]_3$, $[CH_3NH_3][Sn_nPm_{(1-n)}][I]_3$, $[CH_3NH_3][Sn_nGd_{(1-n)}][I]_3$, $[CH_3NH_3][Sn_nTb_{(1-n)}][I]_3$, $[CH_3NH_3][Sn_nHo_{(1-n)}][I]_3$, or $[CH_3NH_3][Sn_nEr_{(1-n)}][I]_3$;

$[Cs][Sn][I]_3$, $[Cs][Sn_nSr_{(1-n)}][I]_3$, $[Cs][Sn_nMg_{(1-n)}][I]_3$, $[Cs][Sn_nCa_{(1-n)}][I]_3$, $[Cs][Sn_nBa_{(1-n)}][I]_3$, $[Cs][Sn_nEu_{(1-n)}][I]_3$, $[Cs][Sn_nYb_{(1-n)}][I]_3$, $[Cs][Sn_nTm_{(1-n)}][I]_3$, $[Cs][Sn_nLa_{(1-n)}][I]_3$, $[Cs][Sn_nCe_{(1-n)}][I]_3$, $[Cs][Sn_nPr_{(1-n)}][I]_3$, $[Cs]

$[Sn_nNd_{(1-n)}][I]_3$, $[Cs][Sn_nPm_{(1-n)}][I]_3$, $[Cs][Sn_nGd_{(1-n)}][I]_3$, $[Cs][Sn_nTb_{(1-n)}][I]_3$, $[Cs][Sn_nHo_{(1-n)}][I]_3$, or $[Cs][Sn_nEr_{(1-n)}][I]_3$;

$[Rb][Pb][I]_3$, $[Rb][Pb_nSr_{(1-n)}][I]_3$, $[Rb][Pb_nMg_{(1-n)}][I]_3$, $[Rb][Pb_nCa_{(1-n)}][I]_3$, $[Rb][Pb_nBa_{(1-n)}][I]_3$, $[Rb][Pb_nEu_{(1-n)}][I]_3$, $[Rb][Pb_nYb_{(1-n)}][I]_3$, $[Rb][Pb_nTm_{(1-n)}][I]_3$, $[Rb][Pb_nLa_{(1-n)}][I]_3$, $[Rb][Pb_nCe_{(1-n)}][I]_3$, $[Rb][Pb_nPr_{(1-n)}][I]_3$, $[Rb][Pb_nNd_{(1-n)}][I]_3$, $[Rb][Pb_nPm_{(1-n)}][I]_3$, $[Rb][Pb_nGd_{(1-n)}][I]_3$, $[Rb][Pb_nTb_{(1-n)}][I]_3$, $[Rb][Pb_nHo_{(1-n)}][I]_3$, or $[Rb][Pb_nEr_{(1-n)}][I]_3$;

$[Rb][Sn][I]_3$, $[Rb][Sn_nSr_{(1-n)}][I]_3$, $[Rb][Sn_nMg_{(1-n)}][I]_3$, $[Rb][Sn_nCa_{(1-n)}][I]_3$, $[Rb][Sn_nBa_{(1-n)}][I]_3$, $[Rb][Sn_nEu_{(1-n)}][I]_3$, $[Rb][Sn_aYb_{(1-n)}][I]_3$, $[Rb][Sn_nTm_{(1-n)}][I]_3$, $[Rb][Sn_nLa_{(1-n)}][I]_3$, $[Rb][Sn_nCe_{(1-n)}][I]_3$, $[Rb][Sn_nPr_{(1-n)}][I]_3$, $[Rb][Sn_nNd_{(1-n)}][I]_3$, $[Rb][Sn_nPm_{(1-n)}][I]_3$, $[Rb][Sn_nGd_{(1-n)}][I]_3$, $[Rb][Sn_nTb_{(1-n)}][I]_3$, $[Rb][Sn_nHo_{(1-n)}][I]_3$, or $[Rb][Sn_nEr_{(1-n)}][I]_3$;

$[K][Pb][I]_3$, $[K][Pb_nSr_{(1-n)}][I]_3$, $[K][Pb_nMg_{(1-n)}][I]_3$, $[K][Pb_nCa_{(1-n)}][I]_3$, $[K][Pb_nBa_{(1-n)}][I]_3$, $[K][Pb_nEu_{(1-n)}][I]_3$, $[K][Pb_nYb_{(1-n)}][I]_3$, $[K][Pb_nTm_{(1-n)}][I]_3$, $[K][Pb_nLa_{(1-n)}][I]_3$, $[K][Pb_nCe_{(1-n)}][I]_3$, $[K][Pb_nPr_{(1-n)}][I]_3$, $[K][Pb_nNd_{(1-n)}][I]_3$, $[K][Pb_nPm_{(1-n)}][I]_3$, $[K][Pb_nGd_{(1-n)}][I]_3$, $[K][Pb_nTb_{(1-n)}][I]_3$, $[K][Pb_nHo_{(1-n)}][I]_3$, or $[K][Pb_nEr_{(1-n)}][I]_3$;

$[K][Sn][I]_3$, $[K][Sn_nSr_{(1-n)}][I]_3$, $[K][Sn_nMg_{(1-n)}][I]_3$, $[K][Sn_nCa_{(1-n)}][I]_3$, $[K][Sn_nBa_{(1-n)}][I]_3$, $[K][Sn_nEu_{(1-n)}][I]_3$, $[K][Sn_nYb_{(1-n)}][I]_3$, $[K][Sn_nTm_{(1-n)}][I]_3$, $[K][Sn_nLa_{(1-n)}][I]_3$, $[K][Sn_nCe_{(1-n)}][I]_3$, $[K][Sn_nPr_{(1-n)}][I]_3$, $[K][Sn_nNd_{(1-n)}][I]_3$, $[K][Sn_nPm_{(1-n)}][I]_3$, $[K][Sn_nGd_{(1-n)}][I]_3$, $[K][Sn_nTb_{(1-n)}][I]_3$, $[K][Sn_nHo_{(1-n)}][I]_3$, or $[K][Sn_nEr_{(1-n)}][I]_3$;

$[CH_3NH_3][Tm][I]_3$, $[CH_3NH_3][Tm_nSr_{(1-n)}][I]_3$, $[CH_3NH_3][Tm_nMg_{(1-n)}][I]_3$, $[CH_3NH_3][Tm_nCa_{(1-n)}][I]_3$, $[CH_3NH_3][Tm_nBa_{(1-n)}][I]_3$, $[CH_3NH_3][Tm_nEu_{(1-n)}][I]_3$, $[CH_3NH_3][Tm_nYb_{(1-n)}][I]_3$, $[CH_3NH_3][Tm_nTm_{(1-n)}][I]_3$, $[CH_3NH_3][Tm_nLa_{(1-n)}][I]_3$, $[CH_3NH_3][Tm_nCe_{(1-n)}][I]_3$, $[CH_3NH_3][Tm_nPr_{(1-n)}][I]_3$, $[CH_3NH_3][Tm_nNd_{(1-n)}][I]_3$, $[CH_3NH_3][Tm_nPm_{(1-n)}][I]_3$, $[CH_3NH_3][Tm_nGd_{(1-n)}][I]_3$, $[CH_3NH_3][Tm_nTb_{(1-n)}][I]_3$, $[CH_3NH_3][Tm_nHo_{(1-n)}][I]_3$, or $[CH_3NH_3][Tm_nEr_{(1-n)}][I]_3$; or $[Cs][Tm][I]_3$, $[CS][Tm_nSr_{(1-n)}][I]_3$, $[Cs][Tm_nMg_{(1-n)}][I]_3$, $[Cs][Tm_nCa_{(1-n)}][I]_3$, $[Cs][Tm_nBa_{(1-n)}][I]_3$, $[Cs][Tm_nEu_{(1-n)}][I]_3$, $[Cs][Tm_nYb_{(1-n)}][I]_3$, $[Cs][Tm_nTm_{(1-n)}][I]_3$, $[Cs][Tm_nLa_{(1-n)}][I]_3$, $[Cs][Tm_nCe_{(1-n)}][I]_3$, $[Cs][Tm_nPr_{(1-n)}][I]_3$, $[CS][Tm_nNd_{(1-n)}][I]_3$, $[Cs][Tm_nPm_{(1-n)}][I]_3$, $[Cs][Tm_nGd_{(1-n)}][I]_3$, $[Cs][Tm_nTb_{(1-n)}][I]_3$, $[Cs][Tm_nHo_{(1-n)}][I]_3$, and $[Cs][Tm_nEr_{(1-n)}][I]_3$, and n may be a real number satisfying $0<n<1$, however, exemplary embodiments of the present invention are not limited thereto.

Light emitted from the perovskite compound represented by Formula 1 may have a relatively small full width at half maximum (FWHM) value. Light emitted from the perovskite compound represented by Formula 1 may exhibit relatively high color purity. The perovskite compound represented by Formula 1 may resemble a single crystal having a quantum well, and thus electrons and holes may directly recombine with the perovskite compound. The perovskite compound represented by Formula 1 may include relatively few parts that are not involved in light emission. Thus, when light emitted from the perovskite compound represented by Formula 1 is illuminated on a color filter, a display apparatus may exhibit a relatively large color gamut.

The perovskite compound represented by Formula 1 is not limited in morphology, and for example, may be in the form of nanoparticles, nanowires, nanolayers, multi-layered nanolayers, microparticles, microwires, microlayers, or multi-layered microlayers.

The perovskite compound represented by Formula 1 may be controlled by controlling, for example, an average particle diameter of the compound, or a compositional ratio of the compound, and thus, a maximum emission wavelength of the perovskite compound represented by Formula 1 may be controlled in various manners.

A method of controlling a maximum emission wavelength of the perovskite compound represented by Formula 1 by controlling a compositional ratio of the compound will be described in more detail below.

In an exemplary embodiment of the present invention, a maximum emission wavelength of the perovskite compound represented by Formula 1 may vary according to A in Formula 1. For example, $[CH_3NH_3][Yb][I]_3$ and $[CH_3NH_3][Eu][I]_3$ may emit blue light, whereas $[Cs][Eu][I]_3$ and $[Cs][Yb][I]_3$ may emit blue-green light.

In some exemplary embodiments of the present invention, a maximum emission wavelength of the perovskite compound represented by Formula 1 may vary according to $B^1$ and $B^2$ in Formula 1. For example, $[Cs][Yb][I]_3$ may emit green light, whereas $[Cs][Eu][I]_3$ may emit blue light. In some exemplary embodiments of the present invention, $[CH_3NH_3][Tm_{0.4}Eu_{0.6}][I]_3$ and $[Cs][Tm_{0.42}Eu_{0.58}][I]_3$ may emit red light, $[CH_3NH_3][Tm_{0.2}Eu_{0.8}][I]_3$ and $[Cs][Tm_{0.23}Eu_{0.77}][I]_3$ may emit green light, and $[CH_3NH_3][Tm_{0.05}Eu_{0.95}][I]_3$ and $[Cs][Tm_{0.05}Eu_{0.95}][I]_3$ may emit blue light.

The thin film 130 may be synthesized according to a known method in the art.

A method of synthesizing a thin film according to an exemplary embodiment of the present invention will be described in more detail below.

A thin film may be formed by depositing an A-containing precursor, a $B^1$-containing precursor, and a $B^2$-containing precursor on an organic light-emitting device (e.g., the organic light-emitting device 120) disposed on a substrate (e.g., the first substrate 110). The thin film may be formed in a region of a second electrode of the organic light-emitting device. Substantially simultaneously or subsequently, heat treatment may be performed on the substrate, thus forming the thin film (e.g., the thin film 130).

For example, by depositing the perovskite compound represented by Formula 1 along with an A-containing precursor, a $B^1$-containing precursor, and a $B^2$-containing precursor on a substrate, and substantially simultaneously performing heat treatment on the substrate, a thin film including the perovskite compound represented by Formula 1 may be manufactured. (Thus the thin film may be formed by a one-step method.

In some exemplary embodiments of the present invention, a film including at least one of the precursors described herein may be formed on a substrate. For example, the film may include the perovskite compound represented by Formula 1 along with an A-containing precursor, a $B^1$-containing precursor, and a $B^2$-containing precursor. Heat treatment may be subsequently performed on the film, and thus a thin film may be formed including the perovskite compound represented by Formula 1. Thus, the thin film may be formed by a two-step method.

A, $B^1$, and $B^2$ in the A-containing precursor, the $B^1$-containing precursor, and the $B^2$-containing precursor, respectively, will each be described in more detail below.

As an example, the A-containing precursor may be selected from halogen compounds of A (e.g., $(A)(X^1)$), the $B^1$-containing precursor may be selected from halogen compounds of $B^1$ (e.g., $(B^1)(X^2)_2$), and the $B^2$-containing precursor may be selected from halogen compounds of $B^2$ (e.g., $(B^2)(X^3)_2)$. Descriptions of A, $B^1$, and $B^2$ in $(A)(X^1)$, $(B^1)(X^2)_2$, and $(B^2)(X^3)_2$ will each independently be understood by referring to the descriptions of A, $B^1$, and $B^2$ in Formula 1 described herein. As an example, $X^1$ to $X^3$ may each independently be selected from —F, —Cl, —Br, or —I.

Conditions for the heat treatment in the method of manufacturing the thin film may vary depending on whether the A in the A-containing precursor includes a monovalent inorganic-cation or not.

For example, when A in the A-containing precursor does not include a monovalent inorganic-cation, the heat treatment in the method of manufacturing the thin film may be selected from time ranges from about 15 minutes to about 1 hour and temperature ranges from about 100° C. to about 400° C., or when A in the A-containing precursor does include a monovalent inorganic-cation, the heat treatment in the method of manufacturing the thin film may be selected from time ranges from about 2 hours to about 48 hours and temperature ranges from about 400° C. to about 800° C., however, exemplary embodiments of the present invention are not limited thereto.

A method of synthesizing a thin film including the perovskite compound represented by Formula 1 according to an exemplary embodiment of the present invention will be described in more detail below.

A thin film including the perovskite compound represented by Formula 1 may be manufactured by depositing a composition including a binder resin and the perovskite compound represented by Formula 1 onto a substrate, followed by being subjected to heat treatment. The perovskite compound represented by Formula 1 may be prepared in advance in the form of nanoparticles, and the composition may include nanoparticles of the perovskite compound represented by Formula 1 and a binder resin.

A method of manufacturing the thin film including the perovskite compound represented by Formula 1 according to an exemplary embodiment of the present invention is described above; however, exemplary embodiments of the present invention are not limited thereto.

The expression "the thin film is positioned in a traveling direction of at least one light emitted from the organic light-emitting device", as used herein, does not exclude a case where other components may exist between the thin film and the organic light-emitting device.

A barrier film, which may reduce or prevent oxygen or moisture from coming into contact with the thin film 130, may be included on at least one surface of the thin film 130. When the thin film 130 includes the barrier film, a state of the perovskite compound which may be vulnerable to oxygen and/or moisture may be maintained in a stable manner.

For example, the barrier film may be formed on a light incident surface of the thin film 130 (e.g., a surface on which light emitted from the organic light-emitting device 120 is absorbed), and/or may be formed on a light extraction surface of the thin film 130 (e.g., a surface from which light is emitted from the organic light-emitting device 120). In some exemplary embodiments of the present invention, the barrier film may completely surround the thin film 130.

The barrier film may include, for example, polyester, polycarbonate, polyolefin, cyclic olefin copolymer (COC), or polyimide, however, exemplary embodiments of the present invention are not limited thereto.

The barrier film may include, on a surface thereof, a single-layered or multi-layered inorganic coating layer. An inorganic material in the inorganic coating layer may be inorganic oxide, such as silica, alumina, titania, zirconia, or any combination thereof. The inorganic coating layer may reduce or prevent a penetration of oxygen or moisture, and thus the barrier film including the inorganic coating layer may increase the oxygen and/or moisture blocking function of the barrier film.

Figure 2:
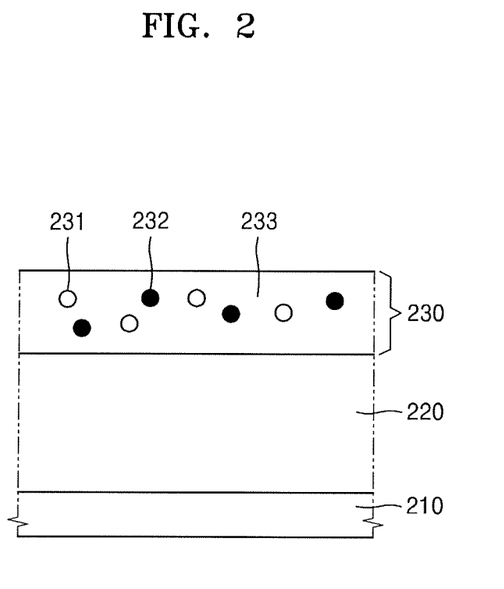
FIGS. 2 to 5 are each an enlarged cross-sectional view of a part of an organic light-emitting display apparatus according to an exemplary embodiment of the present invention.

Referring to FIG. 2, an organic light-emitting device 220 disposed on a substrate 210, may emit a first light, and a thin film 230 may absorb the first light to emit a second light. The first light and the second light may have different maximum emission wavelengths from each other.

For example, a maximum emission wavelength of the first light may be shorter than that of the second light.

In some exemplary embodiments of the present invention, the first light may combine with the second light to emit white light.

The first light may be blue light, and the second light may be at least one selected from green light, yellow light, or red light, however, exemplary embodiments of the present invention are not limited thereto. For example, the first light may be blue light, and the second light may be yellow light or light of mixed color with green and red, however, exemplary embodiments of the present invention are not limited thereto.

The first light may be ultraviolet (UV) light, and the second light may be at least one selected from blue light, green light, or red light, however, exemplary embodiments of the present invention are not limited thereto. For example, the first light may be UV light, and the second light may be light of mixed color with blue (e.g., light in a wavelength band from about 400 nm to about 490 nm), green (e.g., light in a wavelength band from about 490 nm to about 570 nm), or red (e.g., light in a wavelength band from about 570 nm to about 680 nm), however, exemplary embodiments of the present invention are not limited thereto.

For example, the thin film 230 may include a first perovskite compound 231 represented by Formula 1 and a second perovskite compound 232 represented by Formula 1. When average particle diameters of the first and second perovskite compounds 231 and 232 are different from each other, maximum emission wavelengths of the first and second perovskite compounds 231 and 232 may be different from each other. The thin film 230 may be a monolayer film in which the first and second perovskite compounds 231 and 232 are substantially uniformly dispersed. The thin film 230 may include a binder resin 233 that substantially uniformly disperses the first and second perovskite compounds 231 and 232. A mixing ratio of the first and second perovskite compounds 231 and 232 is not limited to a particular ration, and may be controlled to be within a desired range by taking into account desired light characteristics. The binder resin 233 may include, for example, an epoxy resin, a silicon-epoxy resin, a silicon resin, a polystyrene resin, a (meth)acrylate resin, or any combination thereof, however, exemplary embodiments of the present invention are not limited thereto.

In the case that the first light is blue light, the first perovskite compound 231 may emit red light and the second perovskite compound 232 may emit green light. An average particle diameter of the first perovskite compound 231 may be greater than that of the second perovskite compound 232, and for example, the average particle diameter of the first perovskite compound 231 may be about 5 nm. The average particle diameter of the second perovskite compound 232 may be, for example, about 3 nm. In some exemplary embodiments of the present invention, red light emitted from the first perovskite compound 231, and green light emitted from the second perovskite compound 232 may be combined, thus emitting white light.

Figure 3:
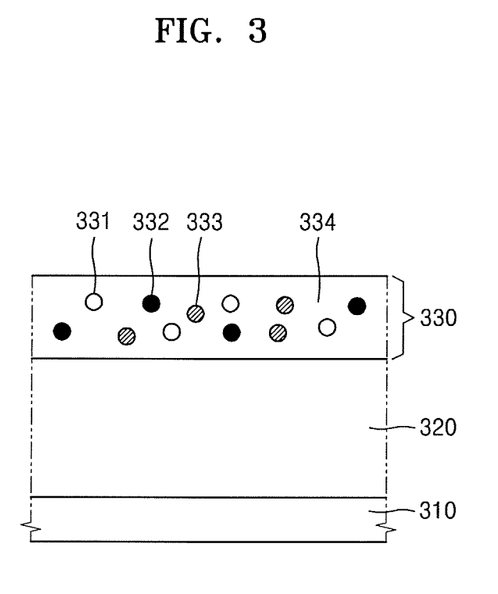

Referring to FIG. 3, an organic light-emitting device 320 disposed on a substrate 310, may emit a first light, and a thin film 330 may absorb the first light to emit a second light. The first light and the second light may have different maximum emission wavelengths from each other. According to some exemplary embodiments of the present invention, the thin film 330 may include a first perovskite compound 331 represented by Formula 1, a second perovskite compound 332 represented by Formula 1, and a third perovskite compound 333 represented by Formula 1. When average particle diameters of the first, second, and third perovskite compounds 331, 332, and 333 are different from each other, maximum emission wavelengths of the first, second, and third perovskite compounds 331, 332, and 333 may be different from each other. The thin film 330 may be a monolayer film in which the first, second, and third perovskite compounds 331, 332, and 333 are substantially uniformly dispersed. The thin film 330 may include a binder resin 334 that substantially uniformly disperses the first, second, and third perovskite compounds 331, 332, and 333. A mixing ratio of the first, second, and third perovskite compounds 331, 332, and 333 is not limited to a particular ratio, and may be controlled to be within a desired range by taking into account desired light characteristics.

When the first light is UV light, the first perovskite compound 331 may emit red light, the second perovskite compound 332 may emit green light, and the third perovskite compound 333 may emit blue light. An average particle diameter of the first perovskite compound 331 may be greater than that of the second perovskite compound 332, and for example, the average particle diameter of the first perovskite compound 331 may be about 5 nm. An average particle diameter of the second perovskite compound 332 may be greater than that of the third perovskite compound 333, and for example, the average particle diameter of the second perovskite compound 332 may be about 3 nm. An average particle diameter of the third perovskite compound 333 may be, for example, from about 2 nm to about 1 nm. In some exemplary embodiments of the present invention, red light emitted from the first perovskite compound 331, green light emitted from the second perovskite compound 332, and blue light emitted from the third perovskite compound 333 may be combined, thus emitting white light.

Figure 4:
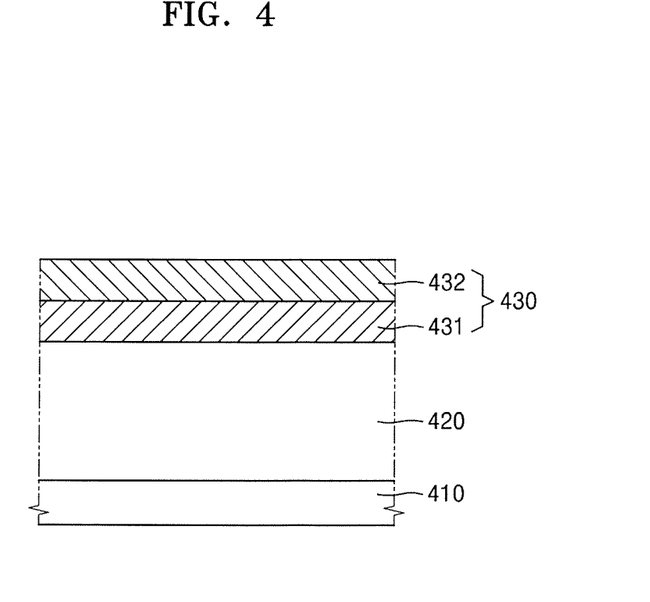

Referring to FIG. 4, an organic light-emitting device 420 disposed on a substrate 410, may emit a first light, and a thin film 430 may absorb the first light to emit a second light. The first light and the second light may have different maximum emission wavelengths from each other. Thin film 430 may include a first thin film 431 and a second thin film 432. An organic light-emitting device 420 may emit a first light, and the first thin film 431 may absorb the first light to emit a second light, and the second thin film 432 may absorb the first light and/or the second light to emit a third light. Maximum emission wavelengths of the first light, the second light, and the third light may be different from each other.

For example, a maximum emission wavelength of the first light may be shorter than maximum emission wavelengths of the second light and the third light. A maximum emission wavelength of the second light may be shorter than that of the third light.

In some exemplary embodiments of the present invention, the first light, the second light, and the third light may be combined, thus emitting white light.

The first light may be blue light, and the second light and the third light may each independently be at least one selected from green light or red light, however, exemplary embodiments of the present invention are not limited thereto. For example, the first light may be blue light, the second light may be green light, and the third light may be red light.

The first light may be UV light, and the second light and the third light may each independently be at least one selected from blue light, cyan light, green light, yellow light, red light, or magenta light, however, exemplary embodiments of the present invention are not limited thereto. In some exemplary embodiments of the present invention, the first light may be UV light, the second light may be cyan light, and the third light may be red light. In some exemplary embodiments of the present invention, the first light may be UV light, the second light may be green light, and the third light may be magenta light. In some exemplary embodiments of the present invention, the first light may be UV light, the second light may be blue light, and the third light may be yellow light.

The first thin film 431 may include a first perovskite compound represented by Formula 1, and the second thin film 432 may include a second perovskite compound, however, exemplary embodiments of the present invention are not limited thereto.

As an example, the first light may be blue light; the first perovskite compound may emit green light, and the second perovskite compound may emit red light, however, exemplary embodiments of the present invention are not limited thereto.

Figure 5:
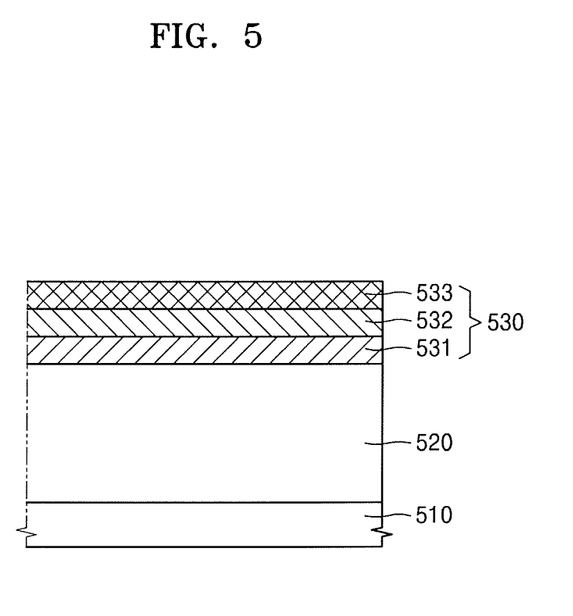

Referring to FIG. 5, an organic light-emitting device 520 disposed on a substrate 510, may emit a first light, and a thin film 530 may absorb the first light to emit a second light. The first light and the second light may have different maximum emission wavelengths from each other. The thin film 530 may include a first thin film 531, a second thin film 532, and a third thin film 533. An organic light-emitting device 520 may emit a first light, the first thin film 531 may absorb the first light to emit a second light, the second thin film 532 may absorb the first light and/or the second light to emit a third light, and the third thin film 533 may absorb the first light, the second light, and/or the third light to emit a fourth light. Maximum emission wavelengths of the first light, the second light, the third light, and the fourth light may be different from each other.

For example, a maximum emission wavelength of the first light may be shorter than maximum emission wavelengths of the second light, the third light, and the fourth light, however, exemplary embodiments of the present invention are not limited thereto. A maximum emission wavelength of the second light may be shorter than maximum emission wavelengths of the third light and the fourth light, however, exemplary embodiments of the present invention are not limited thereto. A maximum emission wavelength of the third light may be shorter than that of the fourth light, however, exemplary embodiments of the present invention are not limited thereto.

In some exemplary embodiments of the present invention, the first light, the second light, the third light, and the fourth light may be combined, thus emitting white light.

As an example, the first light may be blue light, and the second light, the third light, and the fourth light may each independently be at least one selected from green light or red light, however, exemplary embodiments of the present invention are not limited thereto.

In some exemplary embodiments of the present invention, the first light may be UV light, and the second light, the third light, and the fourth light may each independently be at least one selected from blue light, green light, or red light, however, exemplary embodiments of the present invention are not limited thereto. In some exemplary embodiments of the present invention, the first light may be UV light, the second light may be blue light, the third light may be green light, and the fourth light may be red light.

The first thin film 531 may include a first perovskite compound represented by Formula 1, the second thin film 532 may include a second perovskite compound represented by Formula 1, the third thin film 533 may include a third perovskite compound represented by Formula 1, however, exemplary embodiments of the present invention are not limited thereto.

In some exemplary embodiments of the present invention, the first light may be UV light, the first perovskite compound may emit blue light, the second perovskite compound may emit green light, and the third perovskite compound may emit red light, however, exemplary embodiments of the present invention are not limited thereto.

The descriptions above of some of the exemplary embodiments of the present invention are of a top-emission type organic light-emitting display apparatus, and may be also applied to a bottom-emission type organic light-emitting display apparatus. As an example, in bottom-emission type organic light-emitting display apparatus, the first electrode may be a semi-transmissive electrode or a transmissive electrode, and the second electrode may be a reflective electrode and the thin film 530 including the perovskite compound represented by Formula 1 may be formed on a substrate.

Figure 6:
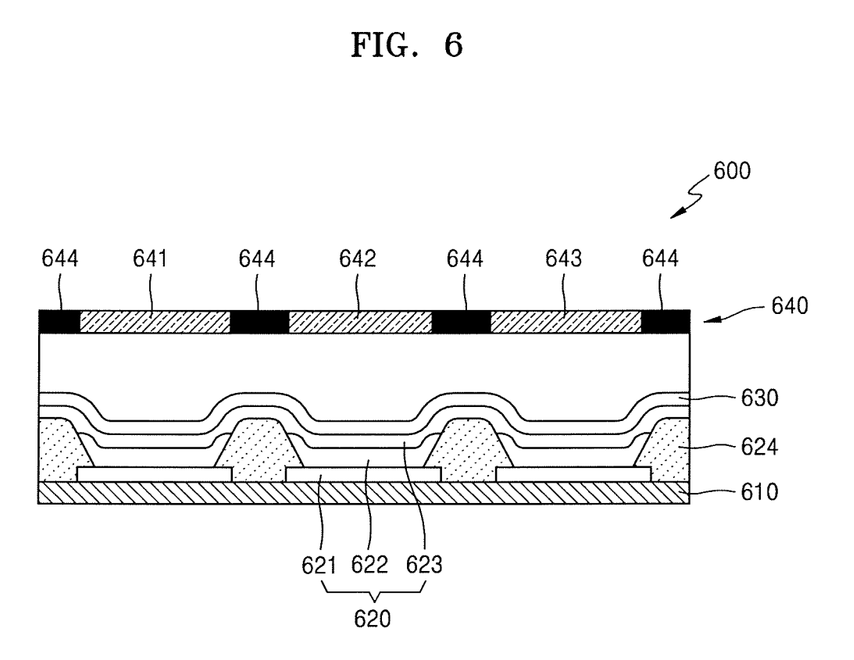
FIG. 6 is a schematic cross-sectional view of an organic light-emitting display apparatus according to an exemplary embodiment of the present invention.

FIG. 6 is a schematic cross-sectional view of an organic light-emitting display apparatus according to an exemplary embodiment of the present invention.

Referring to FIG. 6, an organic light-emitting display apparatus 600 may include a color filter 640 positioned in a traveling direction of light emitted from a thin film 630. An organic light-emitting device 620 may include a first electrode 621, an organic layer 622, and a second electrode 623.

A first substrate 610 may include a plurality of sub-pixel regions, and the color filter 640 may include a plurality of color-filtering regions respectively corresponding to the plurality of sub-pixel regions.

A pixel-defining layer 624 may be formed between each of the plurality of sub-pixel regions, which may define a sub-pixel region of each of the plurality of sub-pixel regions.

The color filter 640 may include a light-blocking pattern 644 between every two adjacent color-filtering regions of the color-filter 640.

The plurality of color-filtering regions may include a first color-filtering region 641 emitting a first color light; a second color-filtering region 642 emitting a second color light; and a third color-filtering region 643 emitting a third color light. The first color light, the second color light, and the third color light may be different from each other. For example, the first color light may be red light, the second color light may be green light, and the third color light may be blue light, however, exemplary embodiments of the present invention are not limited thereto.

The organic light-emitting display apparatuses described with reference to FIGS. 1 to 6 are exemplary embodiments of organic light-emitting display apparatuses, and thus the organic light-emitting display apparatuses may have a variety of configurations known in the art, and to achieve such configurations, a variety of configurations known in the art may be employed.

An organic light-emitting display apparatus according to an exemplary embodiment of the present invention will be described in more detail below.

EXAMPLES

Manufacturing Example 1: Manufacture of Thin Film (1) Including Perovskite Compound Represented by Formula 1

On a glass substrate, $CH_3NH_3I$, $TmI_2$, and $EuI_2$ were co-deposited to have a molar ratio of 1:0.2:0.8. Thus, a precursor-containing layer including $CH_3NH_3I$, $TmI_2$, and $EuI_2$ was formed thereon, and then the precursor-containing layer was subjected to heat treatment for about 15 minutes at a temperature of about 100° C., thus preparing a first thin film having a thickness of about 40 nm and including $(CH_3NH_3)(Tm_{0.2}Eu_{0.8})I_3$.

On the first thin film, $CH_3NH_3I$, $TmI_2$, and $EuI_2$ were co-deposited to have a molar ratio of 1:0.4:0.6. Thus, a precursor-containing layer including $CH_3NH_3I$, $TmI_2$, and $EuI_2$ was formed thereon, and then the precursor-containing layer was subjected to heat treatment for about 15 minutes at a temperature of about 100° C., thus preparing a second thin film having a thickness of about 40 nm and including $(CH_3NH_3)(Tm_{0.4}Eu_{0.6})I_3$, and forming a thin film.

Manufacturing Example 2: Manufacture of Thin Film (2) Including Perovskite Compound Represented by Formula 1

15 ml of octadecene (ODE), 3 ml of oleylamine (OAm), 1.5 ml of oleic acid (OA), and 0.2 g of a mixture of $EuI_2$ and $TmI_2$ (at a molar ratio of 0.8:0.2) were added to a 100 ml 4-necked flask, and then mixed together for about 30 minutes at a temperature of about 100° C. Then, a heat treatment was performed thereon under an argon atmosphere for about 10 minutes at a temperature in a range from about 90° C. to about 130° C.

Next, 0.55 ml of a cesium stearate (CsSt) solution (0.15 M ODE) was instantly added to the 100 ml 4-necked flask, and 5 seconds later, a quenching process was performed thereon in a water tank filled with iced water, thus forming a thin film including a $(Cs)(Tm_{0.2}Eu_{0.8})I_3$ nanolayer.

Manufacturing Example 3: Manufacture of Thin Film (3) Including Perovskite Compound Represented by Formula 1

15 ml of ODE, 3 mo of OAm, 1.5 ml of OA, and 0.2 g of a mixture of $EuI_2$ and $TmI_2$ (at a molar ratio of 0.8:0.2) were added to a 100 ml 4-necked flask, and then mixed together for about 30 minutes at a temperature of about 100° C. Then, a heat treatment was performed thereon under an argon atmosphere for about 10 minutes at a temperature in a range from about 150° C. to about 170° C.

Next, 0.55 ml of a CsSt solution (0.15 M ODE) was instantly added to the 100 ml 4-necked flask, and 5 seconds later, a quenching process was performed thereon in a water tank filled with iced water, thus forming a thin film including a $(Cs)(Tm_{0.2}Eu_{0.8})I_3$ nanoparticle (in a cubic form).

Comparative Manufacturing Example 1: Manufacture of CdSe/ZnS Quantum Dot Film

CdO, stearic acid, and trioctylphosphine oxide were added to a reaction container, and then a heat treatment was performed thereon under an argon atmosphere at a temperature of about 300° C. Next, the reaction container was cooled to room temperature, hexadecylamine was added thereto, and then, a heat treatment was performed thereon under an argon atmosphere at a temperature of about 320° C. Then, Se powder, tributylphosphine, and dioctylamine were added to the reaction container. The reaction container was cooled to a temperature of about 110° C., and gradually heated up to a temperature of about 140° C. CdSe quantum dots (particle diameter from about 5 nm to about 8 nm) obtained therefrom were purified using methanol.

CdSe quantum dots, trioctylphosphine oxide, and hexadecylamine were added to the reaction container, and a heat treatment was performed thereon under an argon atmosphere at a temperature of about 190° C. Then, a mixture of zinc stearate heated up to about 100° C., sulfur powder, trioctyl phosphine, and toluene was added to the reaction container at a rate of about 0.1 ml/min. Then, the mixed solution in the reaction container was stirred at a temperature of about 190° C. for about 1 hour. Thus, a purification process was performed thereon using methanol, thus forming CdSe/ZnS quantum dots having a ZnS shell.

The CdSe/ZnS quantum dots were applied between two barrier films (having a stacked structure of polyimide/$TiO_2$), thus forming a thin film including the CdSe/ZnS quantum dots.

Example 1: Manufacture of Display Apparatus (1)

On a glass substrate, a thin film transistor (TFT) was formed, and a planarization process was performed thereon using a polyimide resin. Then, Ag was patterned on the TFT to a thickness of about 100 nm, and indium tin oxide (ITO) was patterned on the Ag to a thickness of about 20 nm, thus forming a first electrode. Next, a pixel-defining layer was formed on the first electrode using a polyimide resin. The glass substrate was sonicated by using isopropyl alcohol, cleaned by exposure to ultraviolet rays for about 30 minutes, and then, ozone, and the resulting glass substrate was mounted on a vacuum deposition apparatus.

A hole transport layer including PEDOT:PSS:PFI at a thickness of 75 nm was formed as a common layer over the glass substrate.

TBADN and DPAVBi were co-deposited at a weight ratio of 97:3 on the hole transport layer, and then, a first emission layer (emitting blue light) was formed thereon as a common layer. $CH_3NH_3I$, $TmI_2$, and $EuI_2$ were co-deposited at a molar ratio of 1:0.2:0.8 on the first emission layer to thereby form a second emission layer (emitting green light) as a common layer. $CH_3NH_3I$, $TmI_2$, and $EuI_2$ were co-deposited at a weight ratio of 1:0.4:0.6 on the second emission to thus form a third emission layer (emitting red light) as a common layer.

TPBI was deposited on the third emission layer to thereby form an electron transport layer having a thickness of about 50 nm as a common layer. Mg and Ag were co-deposited at a volume ratio of 10:90 on the electron transport layer to thereby form a second electrode having a thickness of about 10 nm, thus forming an organic light-emitting device.

The thin film of Manufacturing Example 1 was formed on the organic light-emitting device, and a color filter including a red color-filtering region, a green color-filtering region, and a blue color-filtering region was disposed on the thin film. The red color-filtering region, the green color-filtering region, and the blue color-filtering region were disposed to respectively correspond with sub-pixels of the organic light-emitting device.

Example 2: Manufacture of Display Apparatus (2)

An organic light-emitting display apparatus was manufactured in the same manner as in Example 1, except that the thin film of Manufacturing Example 2 was used instead of the thin film of Manufacturing Example 1.

Example 3: Manufacture of Display Apparatus (3)

An organic light-emitting display apparatus was manufactured in the same manner as in Example 1, except that the thin film of Manufacturing Example 3 was used instead of the thin film of Manufacturing Example 1.

Comparative Example 1: Manufacture of Comparative Display Apparatus (1)

An organic light-emitting display apparatus was manufactured in the same manner as in Example 1, except that the thin film of Comparative Manufacturing Example 1 was used instead of the thin film of Manufacturing Example 1.

Comparative Example 2: Manufacture of Comparative Display Apparatus (2)

An organic light-emitting display apparatus was manufactured in the same manner as in Example 1, except that the thin film of Manufacturing Example 1 was not used.

Evaluation Example 1: Evaluation of Color Gamut

The color gamut of each of the organic light-emitting display apparatuses of Examples 1 to 3 and Comparative Examples 1 and 2 was measured according to a method provided by the National Television System Committee (NTSC), and the results are shown in Table 1.

The term "100% of NTSC color area" is defined by an area of a triangle surrounded with CIE chromaticity coordinates (red; 0.67, 0.33), (green; 0.21, 0.71), and (blue; 0.14, 0.08). The NTSC color area of each of the organic light-emitting display apparatuses of Examples 1 to 3 and Comparative Examples 1 and 2 was measured, and a relative percentage ratio of the measurement with respect to 100% of the NTSC color area was defined as color gamut.

TABLE 1

| | Color gamut |
|---|---|
| Example 1 | 124% |
| Example 2 | 130% |
| Example 3 | 135% |
| Comparative Example 1 | 115% |
| Comparative Example 2 | 105% |

Referring to Table 1, it was confirmed that the organic light-emitting display apparatuses of Examples 1 to 3 exhibited a relatively large color gamut, compared to that of the organic light-emitting display apparatuses of Comparative Examples 1 and 2.

An organic light-emitting display apparatus according to the one or more exemplary embodiments of the present invention may exhibit increased color gamut.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of the present invention.

What is claimed is:

1. An organic light-emitting display apparatus, comprising:
a first substrate;
an organic light-emitting device disposed on the first substrate; and
a thin film comprising at least one perovskite compound represented by Formula 1 disposed on the organic light-emitting device,
wherein the thin film is positioned in a traveling direction of light emitted from the organic light-emitting device:

$$[A][B^1_n B^2_{(1-n)}][X]_3 \quad <\text{Formula 1}>$$

wherein, in Formula 1,
A is at least one monovalent organic-cation, at least one monovalent inorganic-cation, or a combination thereof,
$B^1$ and $B^2$ are each independently at least one divalent inorganic-cation, wherein $B^1$ and $B^2$ are different from each other,
wherein $B^1$ and $B^2$ are each independently $La^{2+}$, $Ce^{2+}$, $Pr^{2+}$, $Nd^{2+}$, $Pm^{2+}$, $Eu^{2+}$, $Gd^{2+}$, $Tb^{2+}$, $Ho^{2+}$, $Er^{2+}$, $Tm^{2+}$, $Yb^{2+}$, $Lu^{2+}$, $Be^{2+}$, $Mg^{2+}$, $Ca^{2+}$, $Sr^{2+}$, $Ba^{2+}$, $Ra^{2+}$, $Pb^{2+}$, $Sn^{2+}$, or a combination thereof,
wherein if $B^1$ is $Eu^{2+}$, $B^2$ is not $Pb^{2+}$ or $Sn^{2+}$,
wherein if $B^2$ is $Eu^{2+}$, $B^1$ is not $Pb^{2+}$ or $Sn^{2+}$,
n is a real number satisfying 0<n<1, and
X is at least one monovalent anion.

2. The organic light-emitting display apparatus of claim 1, wherein A is $(R_1R_2R_3R_4N)^+$, $(R_1R_2R_3R_4P)^+$, $(R_1R_2R_3R_4As)^+$, $(R_1R_2R_3R_4Sb)^+$, a substituted or unsubstituted cycloheptatrienium, $Li^+$, $Na^+$, $K^+$, $Rb^+$, $Cs^+$, $Fr^+$, or a combination thereof,
at least one of $R_1$ to $R_4$ and substituents of the substituted cycloheptatrienium are each independently selected from hydrogen, deuterium, —F, —Cl, —Br, —I, a hydroxyl group, a $C_1$-$C_{20}$ alkyl group, a $C_2$-$C_{10}$ alkenyl group, a $C_2$-$C_{10}$ alkynyl group, a $C_1$-$C_{20}$ alkoxy group, or —N($Q_1$)($Q_2$), and
$Q_1$ and $Q_2$ are each independently selected form hydrogen, deuterium, a $C_1$-$C_{20}$ alkyl group, a $C_2$-$C_{10}$ alkenyl group, a $C_2$-$C_{10}$ alkynyl group, or a $C_1$-$C_{20}$.

3. The organic light-emitting display apparatus of claim 1, wherein $B^1$ is $Pb^{2+}$, $Sn^{2+}$, or a combination thereof, and $B^2$ is $La^{2+}$, $Ce^{2+}$, $Pr^{2+}$, $Nd^{2+}$, $Pm^{2+}$, $Gd^{2+}$, $Tb^{2+}$, $Ho^{2+}$, $Er^{2+}$, $Tm^{2+}$, $Yb^{2+}$, $Mg^{2+}$, $Ca^{2+}$, $Sr^{2+}$, $Ba^{2+}$, or a combination thereof; or
$B^1$ is $Tm^{+2}$, and $B^2$ is $La^{2+}$, $Ce^{2+}$, $Pr^{2+}$, $Nd^{2+}$, $Pm^{2+}$, $Eu^{2+}$, $Gd^{2+}$, $Tb^{2+}$, $Ho^{2+}$, $Er^{2+}$, $Yb^{2+}$, $Mg^{2+}$, $Ca^{2+}$, $Sr^{2+}$, $Ba^{2+}$, $Pb^{2+}$, $Sn^{2+}$, or a combination thereof.

4. The organic light-emitting display apparatus of claim 1, wherein X is $I^-$.

5. The organic light-emitting display apparatus of claim 1, wherein the organic light-emitting device emits a first light,
the thin film absorbs the first light and emits a second light, and
the first light and the second light have different maximum emission wavelengths from each other.

6. The organic light-emitting display apparatus of claim 5, wherein the thin film comprises a first perovskite compound represented by Formula 1 and a second perovskite compound represented by Formula 1.

7. The organic light-emitting display apparatus of claim 5, wherein the thin film comprises a first perovskite compound represented by Formula 1, a second perovskite compound represented by Formula 1, and a third perovskite compound represented by Formula 1.

8. The organic light-emitting display apparatus of claim 1, wherein the thin film comprises a first thin film and a second thin film,
the organic light-emitting device emits a first light,
the first thin film absorbs the first light and emits a second light,
the second thin film absorbs the first light and/or the second light and emits a third light, and
the first light, the second light, and the third light have different maximum emission wavelengths from each other.

9. The organic light-emitting display apparatus of claim 8, wherein the first thin film comprises a first perovskite compound represented by Formula 1, and
the second thin film comprises a second perovskite compound represented by Formula 1.

10. The organic light-emitting display apparatus of claim 8, wherein the first light is blue light, and
the second light and the third light are each independently at least one selected from green light or red light.

11. The organic light-emitting display apparatus of claim 1, wherein the thin film comprises a first thin film, a second thin film, and a third thin film,
the organic light-emitting device emits a first light,
the first thin film absorbs the first light and emits a second light,
the second thin film absorbs the first light and/or the second light and emits a third light,
the third thin film absorbs the first light, the second light, and/or the third light and emits a fourth light, and
the first light, the second light, the third light, and the fourth light have different maximum emission wavelengths from each other.

12. The organic light-emitting display apparatus of claim 11, wherein the first thin film comprises a first perovskite compound represented by Formula 1,
the second thin film comprises a second perovskite compound represented by Formula 1, and
the third thin film comprises a third perovskite compound represented by Formula 1.

13. The organic light-emitting display apparatus of claim 11, wherein the first light is ultraviolet (UV) light, and
the second light, the third light, and the fourth light are each independently at least one selected from blue light, green light, or red light.

14. The organic light-emitting display apparatus of claim 1, wherein the organic light-emitting device comprises:
a first electrode;
a second electrode facing the first electrode; and
an organic layer disposed between the first electrode and the second electrode, wherein the organic layer comprising an emission layer.

15. The organic light-emitting display apparatus of claim 14, wherein the first electrode is disposed between the first substrate and the organic layer,
the second electrode is disposed between the organic layer and the thin film, and
the first electrode is a reflective electrode.

16. The organic light-emitting display apparatus of claim 1, further comprising a color filter positioned in a traveling direction of light emitted from the thin film,
wherein the first substrate comprises a plurality of subpixel regions, and wherein the color filter comprises a plurality of color-filtering regions respectively corresponding to the plurality of sub-pixel regions.

17. The organic light-emitting display apparatus of claim 16, wherein the plurality of color-filtering regions comprise:
a first color-filtering region that emits a first color light;
a second color-filtering region that emits a second color light; and
a third color-filtering region that emits a third color light, and
the first color light, the second color light, and the third color light are different from each other.

18. The organic light-emitting display apparatus of claim 17, wherein the first color light is red light, the second color light is green light, and the third color light is blue light.

19. An organic light-emitting display apparatus, comprising:
a first substrate;
an organic light-emitting device disposed on the first substrate; and
a thin film comprising at least one perovskite compound represented by Formula 1 disposed on the organic light-emitting device,
wherein the thin film is positioned in a traveling direction of light emitted from the organic light-emitting device:

$$[A][B^1{}_n B^2{}_{(1-n)}][X]_3 \qquad <\text{Formula 1}>$$

wherein, in Formula 1,
A is at least one monovalent organic-cation, at least one monovalent inorganic-cation, or a combination thereof,
$B^1$ and $B^2$ are each independently $La^{2+}$, $Ce^{2+}$, $Pr^{2+}$, $Nd^{2+}$, $Pm^{2+}$, $Eu^{2+}$, $Gd^{2+}$, $Tb^{2+}$, $Ho^{2+}$, $Er^{2+}$, $Tm^{2+}$, $Yb^{2+}$, $Lu^{2+}$, $Be^{2+}$, $Mg^{2+}$, $Ca^{2+}$, $Sr^{2+}$, $Ba^{2+}$, $Ra^{2+}$, or a combination thereof, and $B^1$ and $B^2$ do not include $Sn^{2+}$, wherein $B^1$ and $B^2$ are different from each other,
n is a real number satisfying 0<n<1, and
X is at least one monovalent anion.

* * * * *